United States Patent
Gudeman (10) Patent No.: US 11,258,425 B2
(45) Date of Patent: Feb. 22, 2022

(54) MICROFABRICATED NOTCH FILTER

(71) Applicant: Innovative Micro Technology, Goleta, CA (US)

(72) Inventor: Christopher S. Gudeman, Lompoc, CA (US)

(73) Assignee: Innovative Micro Technology, Goleta, CA (US)

(*) Notice: Subject to any disclaimer, the term of this patent is extended or adjusted under 35 U.S.C. 154(b) by 5 days.

(21) Appl. No.: 16/888,878

(22) Filed: Jun. 1, 2020

(65) Prior Publication Data
US 2020/0389149 A1    Dec. 10, 2020

Related U.S. Application Data

(60) Provisional application No. 62/858,016, filed on Jun. 6, 2019.

(51) Int. Cl.
| | |
|---|---|
| *H01P 7/06* | (2006.01) |
| *H01P 1/12* | (2006.01) |
| *H03H 9/02* | (2006.01) |
| *H03H 9/64* | (2006.01) |
| *H01P 7/08* | (2006.01) |
| *H01P 1/18* | (2006.01) |
| *H03H 9/15* | (2006.01) |

(52) U.S. Cl.
CPC ...... *H03H 9/02976* (2013.01); *H03H 9/6409* (2013.01); *B81B 2201/01* (2013.01); *H03H 2009/155* (2013.01)

(58) Field of Classification Search
CPC .... H01P 1/12; H01P 1/127; H01P 1/18; H01P 1/182; H01P 1/184; H01P 7/06; H01P 7/708; H01P 7/082; H01P 7/088; H01P 9/00
See application file for complete search history.

(56) References Cited

U.S. PATENT DOCUMENTS

| 7,068,220 B2 * | 6/2006 | DeNatale | H01P 1/184 333/105 |
|---|---|---|---|
| 10,594,030 B2 * | 3/2020 | Lee | H01Q 3/30 |
| 2017/0187086 A1 * | 6/2017 | Koul | H01P 1/182 |

* cited by examiner

*Primary Examiner* — Dean O Takaoka
(74) *Attorney, Agent, or Firm* — Jaquelin K. Spong (57) ABSTRACT

A microfabricated RF filter uses a resonant cavity weakly coupled to a transmission line, to attenuate noise sources emitting interference into the RF radiation at the resonant frequency. Radiation at the resonant frequency is leaked into the resonant cavity and build up there, until it is dumped to ground by a switch.

23 Claims, 6 Drawing Sheets

MICROFABRICATED NOTCH FILTER

CROSS REFERENCE TO RELATED APPLICATIONS

This US nonprovisional patent application claims priority to U.S. Provisional Application Ser. No. 62/858,016, filed Jun. 6, 2019. This preceding application is incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to microfabricated notch filter.

Notch filters provide a means of providing loss in a narrow band of the radio frequency (RF) spectrum, which generally extends from hundreds of kHz to hundreds of GHz. This loss allows interfering signals to be attenuated, thus improving the fidelity at the receiver, preventing saturation in the low noise amplifier (LNA), and in worst case, preventing damage to the receiver.

For the mmWave part of the spectrum (generally >3 GHz), conventional filters comprised of capacitors and inductors do not work because (1) the required values of capacitance and inductance are extremely low and are comparable to the parasitic reactance in the circuit and (2) capacitor and inductors tend to be very lossy, thus attenuating the desired signal.

mmWave filters often use cavities, wherein the characteristic dimension of the cavity, i.e. the dimension along the direction of propagation, is one-half the wavelength of the electromagnetic radiation of interest. These cavities are often placed in the RF circuit in series with other components, such as low noise amplifiers, mixers and detectors. Thus, in this series configuration, the cavity acts as a bandpass filter, where a narrow band of spectrum is un-attenuated. This un-attenuated region of the spectrum is generally allocated to the frequency where the desired signal is carried. Often an interfering signal may fall within the desired signal passband or close to the desired signal passband.

Attenuation placed precisely at the frequency of the interferer will improve the fidelity at the receiver, prevent saturation in the LNA, or in worst case, preventing damage to the receiver. If a cavity similar to that described above is used in a shunt configuration it becomes a band-stop filter. If the width in frequency of the band-stop filter is very narrow, this is often called a notch filter. But because cavities often require deep substrates in which the cavity is created and because cavities often require breadth similar to the depth, the close packing of cavities can be limited, leading to large, costly circuits. LC resonant circuits can provide very narrow band-stop filtering, particularly at low frequencies (<10 MHz). For mmWave applications, low loss capacitors (C) and inductors (L) are very difficult to fabricate economically.

What is needed is a low cost, compact, low loss, narrow band device to attenuate interference in the mmWave region of the electromagnetic spectrum

SUMMARY

We describe here a method that employs a plurality of MEMS switches and a plurality of surface acoustic wave (SAW) filters to provide a circuit with signal attenuation over a narrow range of frequencies. The device may be fabricated lithographically on a semiconductor substrate in a volume process at low cost.

Accordingly, disclosed here is an RF notch filter. The RF filter may include a source of RF radiation at with a first characteristic frequency, wherein the RF radiation travels along a transmission line in a substrate, a noise signal added to the RF radiation at a second characteristic frequency, at least one resonant cavity dimensioned so as to resonate/support a standing wave at the second characteristic frequency, and a weak coupling between the cavity and the transmission line, such that radiation at the second characteristic frequency is coupled into the cavity and thereby attenuated in the transmission line.

Also disclosed is a method for filtering jamming noise from an RF communications signal. The method may include receiving the RF communications signal with a receiver and delivering the signal to a transmission line, coupling at least one resonant cavity coupled to the transmission line, and coupling at least one MEMS switch to the resonant cavity, such that when the MEMS switch is closed the resonant cavity is grounded, and when the switch is open, the resonant cavity is electrically floating.

These and other features and advantages are described in, or are apparent from, the following detailed description.

BRIEF DESCRIPTION OF THE DRAWINGS

Various exemplary details are described with reference to the following figures, wherein.

It should be understood that the drawings are not necessarily to scale, and that like numbers may refer to like features.

DETAILED DESCRIPTION

This method uses a microfabricated architecture including MEMS switches and small dimensioned cavity resonators to filter a noise source from a communications signal.

The jamming of a radio frequency (RF) communication signal is often accomplished by adding noise to the primary signal. The noise may be in the form of radiation and other frequencies added to the primary signal. The existence of noise on the signal makes the signal harder to decode, introduces errors, and generally reduces the reliability of the communication pathway. Being able to remove or illuminate this noise is a central problem in communications, in both military and civilian applications.

The distinguishing feature of the notch filter is its ability to filter out a noise source is having a particular frequency. In the embodiments described here, the filtering function is accomplished by adding a resonant cavity to the communication system. The resonant cavity is weakly coupled to a strip line or coplanar waveguide that carries the primary signal. The cavity is dimensioned so as to be resonant at a particular frequency. The resonant frequency can then be altered by adding additional resonant cavities in various different arrangements. Because of the weak coupling between the resonant cavity and the primary strip line, energy may be leaked out of the transmission line and into the cavity, such that energy builds up with in the resonant cavity. When a critical energy level is reached, that energy may be dumped to a damping load, which eliminates the filtering properties of the strip line for an interval of time.

The following discussion presents a plurality of exemplary embodiments of the novel microfabricated notch filter. The following reference numbers are used in the accompanying figures to refer to the following:

100 Source of RF radiation
110 Strip-line or CPW
120 Output load
130 Strip-line or Cavity resonator
140 MEMS Switch
150 Damping load
160 SAW filter bank
170 Detector/inverter
180 Buffer/driver A plurality of embodiments of the microfabricated notch filter are described below, using these reference numbers. The appended figures illustrate a number of different embodiment of this concept.

As used herein, the following terms may have the following meanings, which are consistent with usage by those skilled in the art. A stripline may be a transmission line trace surrounded by dielectric material suspended between two ground planes on internal layers of a PCB. A coplanar waveguide (CPW) may be is a type of electrical planar transmission line which can be fabricated using printed circuit board technology, and is used to convey microwave-frequency signals. On a smaller scale, coplanar waveguide transmission lines are also built into monolithic microwave integrated circuits. Conventional coplanar waveguide (CPW) consists of a single conducting track printed onto a dielectric substrate, together with a pair of return conductors, one to either side of the track. All three conductors are on the same side of the substrate, and hence are coplanar. The return conductors are separated from the central track by a small gap, which has an unvarying width along the length of the line. Away from the central conductor, the return conductors usually extend to an indefinite but large distance, so that each is notionally a semi-infinite plane. An antenna may be transducer designed to transmit or receive electromagnetic (e.g., TV or radio) waves. A resonator is a device or system that exhibits resonance Or resonant behavior, that is, it naturally oscillates at some frequencies, called its resonant frequencies, with greater amplitude than at others. A cavity resonator is one in which waves exist in a space inside the device. Inductive coupling occurs when two conductors are configured such that a change in current through one wire induces a voltage across the ends of the other wire through electromagnetic induction. Accordingly, the conductors are near but not touching when the coupling occurs. A changing current through the first wire creates a changing magnetic field around it by Ampere's circuital law. The changing magnetic field induces an electromotive force (EMF or voltage) in the second wire by Faraday's law of induction. The amount of inductive coupling between two conductors is measured by their mutual inductance.

Figure 1:
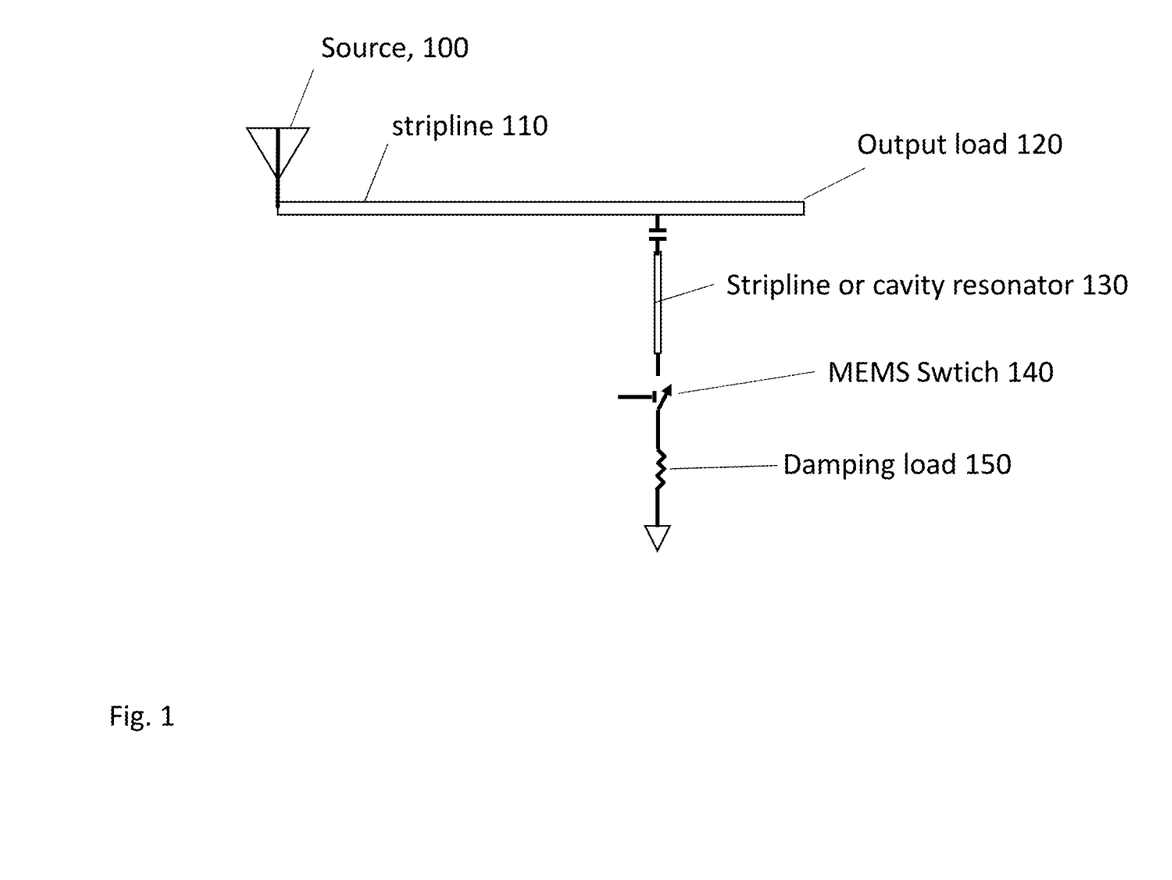
FIG. 1 is a schematic diagram of a first exemplary embodiment of a microfabricated notch filter.

FIG. 1 illustrates a first embodiment of this microfabricated notch filter. FIG. 1 shows the source, 100, coupled to a strip line, 110. The source may be an RF antenna for example, or some other receiver. The antenna 100 may receive broadcast radiation broadcast, and couples this radiation into a transmission line or waveguide 110. The transmission line 100 may be a coplanar waveguide (CPW) or a stripline, for example. The transmission line 100 transmits this radiation as a traveling wave traveling along transmission line 110 to an output load, 120. The output load can be, for example, a low noise amplifier (LNA).

A small capacitor 125 may provide a weak coupling between the transmission line 110, and a cavity resonator 130. The capacitance of the capacitor 125 may be on the order of the 10 picofarads. Accordingly, the capacitor will leak signal from the transmission 110 into the cavity resonator 130.

The energy building in the cavity resonator 130 may build up to a critical level, at which point a microelectromechanical systems (MEMS) switch, 140, maybe closed. However, other criteria may also or instead be used to close the MEMS switch and dump the energy. These other options may include 1) the energy of the RF radiation exceeds a certain level 2) the fidelity of the communications pathway deteriorates 3) the low noise amplifier saturates 4) the passage of a predefined period of time 5) operator judgement for any other reason.

This cavity resonator 130 may also have similar architecture as the first transmission line 110. In other words, the cavity resonator 130 may be a second strip line or transmission line 130, similar to the first transmission line 110.

When the MEMS switch 140 is closed, the energy contained in the cavity resonator may be dumped to a damping load, 150, and then to ground. During this period, the filtering function of the notch filter may not be operative. However the filtering function will resume when the MEMS switch is reopened. The period during which the MEMS switch is closed, the cavity resonator 130 is not collecting energy from the transmission line 110. This period may be made quite short, on the order of nanoseconds.

In addition to the antenna 100, the input may be from an amplifier, mixer, power splitter, or oscillator, for example. The transmission line 110 may be a stripline, coaxial cable, or coplanar waveguide (CPW), for example. At some point along the transmission line, RF energy is coupled into a second transmission line, which may also referred to as the resonant cavity 130. It should be understood the resonant "cavity" may simply be a length of transmission line having appropriate dimensions to support a standing wave.

The coupling between these two transmission lines 110 and 130 may be designed to be very weak so that the net power reaching the output load 120 is not significantly affected. Weak coupling can be accomplished with a small capacitor (<0.1 pF). Such a capacitive coupling may be achieved simply be placing the transmission lines into close proximity and allowing the cross talk or capacitive coupling to couple radiation into the resonant cavity. Here, "close proximity" may be on the order of about 1 micron between the two transmission lines 110 and 130. This arrangement may obviate the need for an addition component to be added in the circuit. It should be understood that the weak coupling 125 may refer either to a discrete component 125 or to a arrangement between the transmission lines as described above.

The distal end of the second transmission line or resonant cavity 130 may be connected to a low loss switch, such as a RF MEMS switch. This switch will generally be in the closed position so that any energy coupled into the second transmission line or resonant cavity 130 will be dissipated. If the switch is in the open position energy that is coupled into the second transmission line or resonant cavity 130 will reflect from the distal end. As more energy is coupled into the second transmission line or resonant cavity 130, a standing wave at the resonant frequency of the second transmission line or resonant cavity 130 builds in amplitude.

The resonant frequency of a transmission line or resonant cavity 130 may be expressed by:

$$V_{res} = V_{phase}/2L$$

where L is the length of the transmission line or resonant cavity 130 and $V_{phase}$ is the phase velocity of the RF signal in the transmission line or resonant cavity 130. For example, if the phase velocity in the transmission line is about 3e6 meters/sec or 1% of the speed in free space, and the cavity dimension is on the order of about 75 microns, the cavity will resonate at about 33 GHz, This situation is shown and demonstrated in the embodiment described below.

Figure 2:
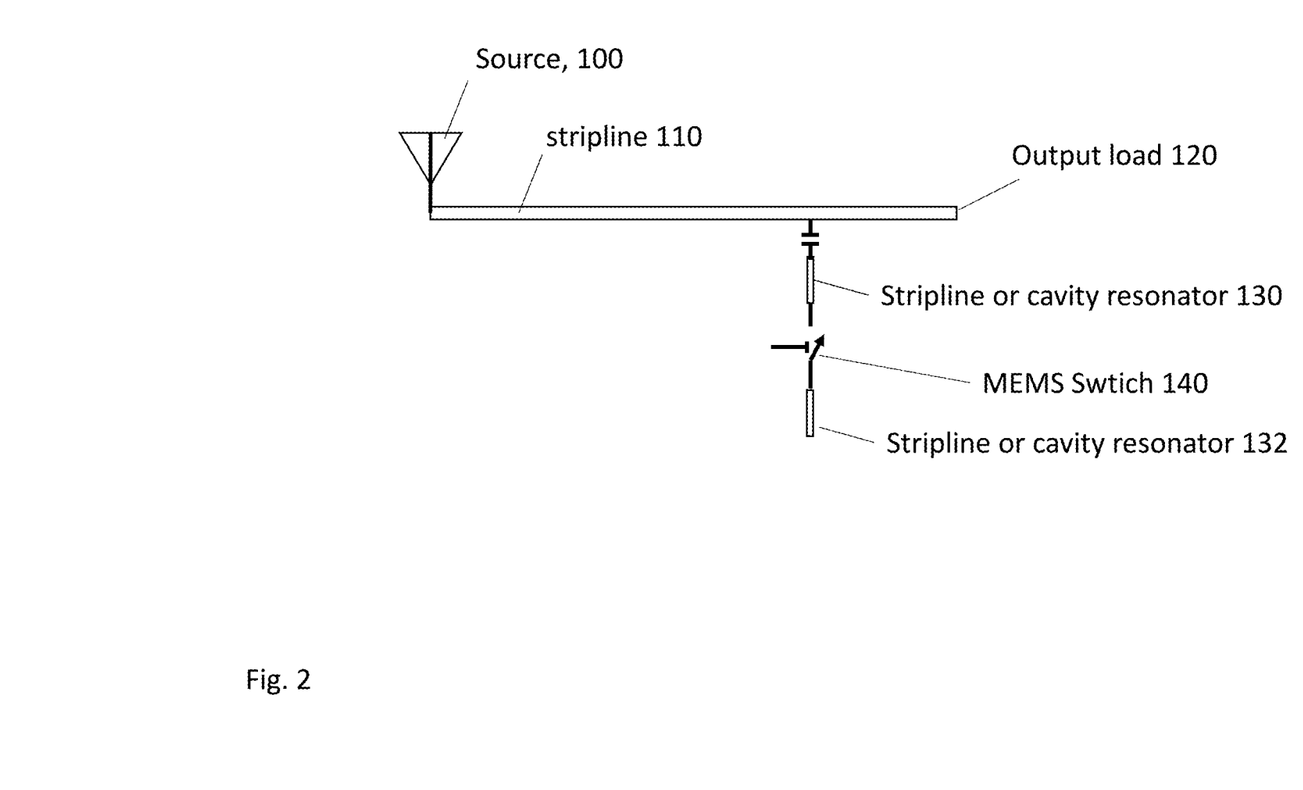
FIG. 2 is a schematic diagram of a second exemplary embodiment of a microfabricated notch filter.

FIG. 2 is another illustration of a second exemplary embodiment of microfabricated notch filter. Similar to the first embodiment, a source 100, which may be an antenna, 100, may receive radio frequency broadcast radiation over the air, in the RF band. The antenna or source, 100, may again be coupled to a transmission line, strip line or coplanar waveguide 110. The signal received from the antenna, 100, will therefore be coupled into the strip line 110 where it may become a traveling wave in the waveguide or transmission line. This radiation is ultimately delivered to the output load, 120. As before, the output load 120 may be a low noise amplifier or other application, for example.

Attached to the strip line 110, may be an inductive coupling provided by a small capacitor. This capacitor may weakly couple the signal traveling in the strip line or transmission line 110 into the strip light or cavity resonator 130. Accordingly, the capacitor serves the function of leaking the signal traveling in the strip line 110 into the cavity resonator. The energy deposited in the cavity resonator 130 may build up to a threshold level. When that threshold level is reached, a MEMS switch, 140, may be closed. At this point the energy in the cavity resonator is dropped to a damping load 150 and then to ground. Accordingly, the function of the strip line or cavity resonator 130 is to bleed off energy that has a frequency that is resonant in the cavity. Ideally, this frequency is the frequency of the noise or jamming signal. Accordingly, by using the strip line or cavity resonator, a noise source that is broadcast at a certain frequency may be removed, when the frequency matches that supported by the cavity resonator 130.

In the second embodiment as in the first, the second strip line or cavity resonator 130 may be weakly coupled to a first strip line 110 with a parasitic capacitor. In this case a low loss switch, such as an RF MEMS switch, is employed to couple a third transmission line or cavity resonator 132 to the second transmission line or cavity resonator 130. The effective length of the second and third transmission line or cavity resonator 130 and 132, when they are coupled by placing the MEMS switch in the closed position is the sum of the length of transmission line or cavity resonator 130. and transmission line or cavity resonator 132. This effective length can then be designed in so that it creates a notch at the frequency of the interferer. If transmission line or cavity resonator 130. and transmission line or cavity resonator 132 are short and the switch is placed in the open position, then $v_{res}$ will occur at a very high frequency, which can be chosen to be so high that it is not of consequence, as it is well out of the operating band of this device.

Although two cavity resonators 130 and 132 separated by a single MEMS switch 140 are shown in FIG. 2, it should be understood that this concept may be extended to any number of additional switches and resonators, arranged in series as shown in FIG. 2. Using such an architecture, the microfabricated notch filter may become essentially tunable, by switching a plurality of additional resonant cavities 130 into or out of operation within the device.

Figure 3:
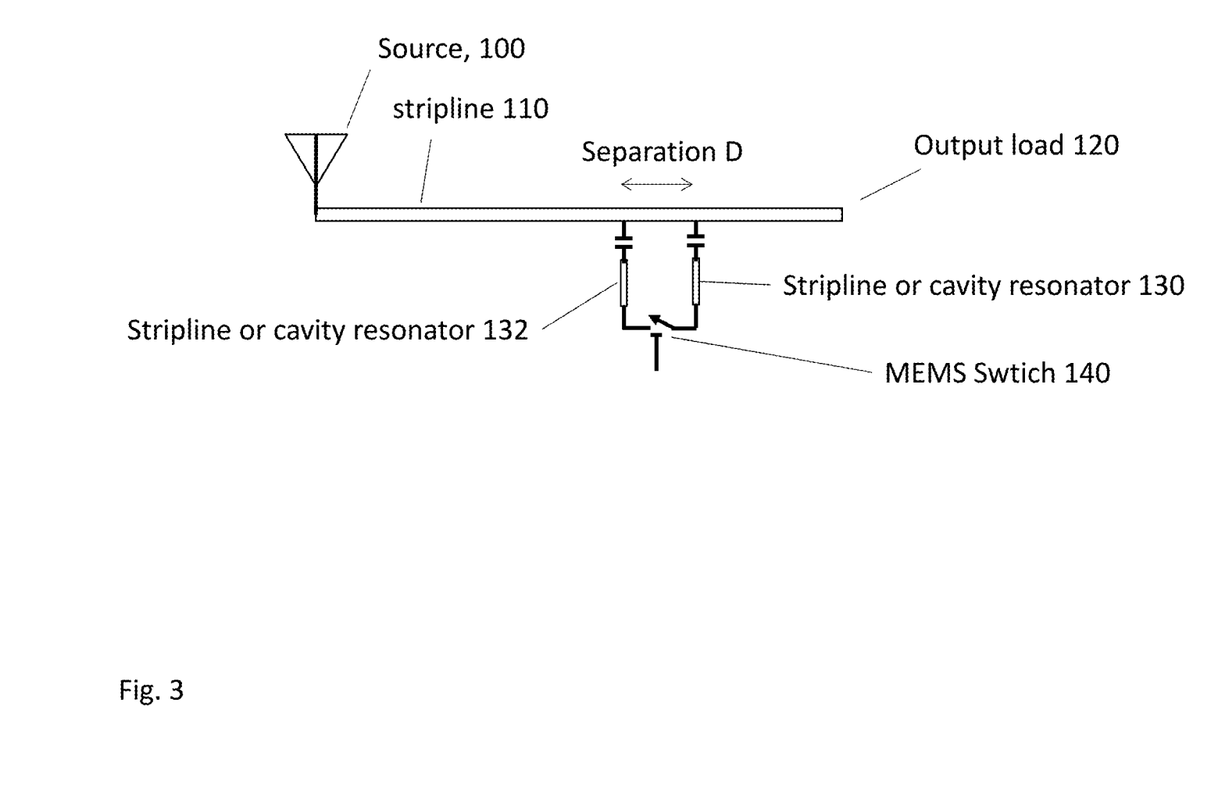
FIG. 3 is a schematic diagram of a third exemplary embodiment of a microfabricated notch filter.

FIG. 3 illustrates a third embodiment of the microfabricated notch filter. As in the previous embodiments, the embodiment illustrated in FIG. 3 may have a source, 100, which may be an RF antenna. The source may receive an RF signal broadcast over the air, and may deliver it to a transmission line 110 or coplanar waveguide, 110. This transmission line 110 may deliver the RF energy as a traveling wave to an output load, 120. In this embodiment, there may be a plurality of capacitors 125 and 127 which couple to the transmission line 110 to the secondary and tertiary transmission lines and resonant cavities 130 and 132. These capacitors 125 and 127 may provide a leak path, through which energy may be leaked from the transmission line 110 to a cavity resonator 130. Accordingly, cavity resonator 130 may be electrically coupled to the transmission line 110 inductively, via capacitor 125, and cavity resonator 132 may be electrically coupled to the transmission line 110 inductively, via capacitor 127. By extension, in these embodiments, there may be a plurality of such capacitors arranged in parallel, a coupled to the strip line, 110. Each of these capacitors may provide a weak coupling between the transmission line 110, and a plurality of cavity resonators 130, 132, 134, etc. Although two sets of capacitors 125, 127 and cavity resonators 130 and 132 are shown in FIG. 3, it should be understood that this concept may be extended to any number of additional couplings and resonators, arranged in parallel.

These cavity resonators may be arranged in parallel, like the capacitors, and may support a resonating frequency depending on the dimensions. When the incoming RF radiation contains this frequency, this frequency may be bled off through the capacitors and into the cavity resonator 130. The energy may build up with in the cavity resonator until on the MEMS switch 140 is closed. At this point the energy stored in the cavity resonators 130 and 132 will be dumped to a damping load 150. In this respect, the third embodiment is similar to the first two embodiments.

The two capacitors 125 and 127 may be separated by a distance D. This distance D and the adjacent capacitors 125 and 127 may be disposed at a particular point in the transmission line, 110. This point may be chosen to be a node of the wave existing and transmission line 110. As described previously, using a careful selection of the spacing between the transmission line or cavity resonators 130, the coupled energy may be maximized or minimized.

As shown in FIG. 3, the second and a third transmission line or cavity resonator 130, 132 may be directly coupled, albeit weakly, to the first transmission line 110. These second and a third transmission line or cavity resonators 130, 132 will resonate at their respective resonant frequency when the low loss switch in in the open position. When the switch is closed the resonant frequency of the combined second and a third transmission line or cavity resonator 130, 132 will be based on the sum of their lengths. This embodiment may provide higher attenuation of an interferer than that of embodiment 2.

Figure 4:
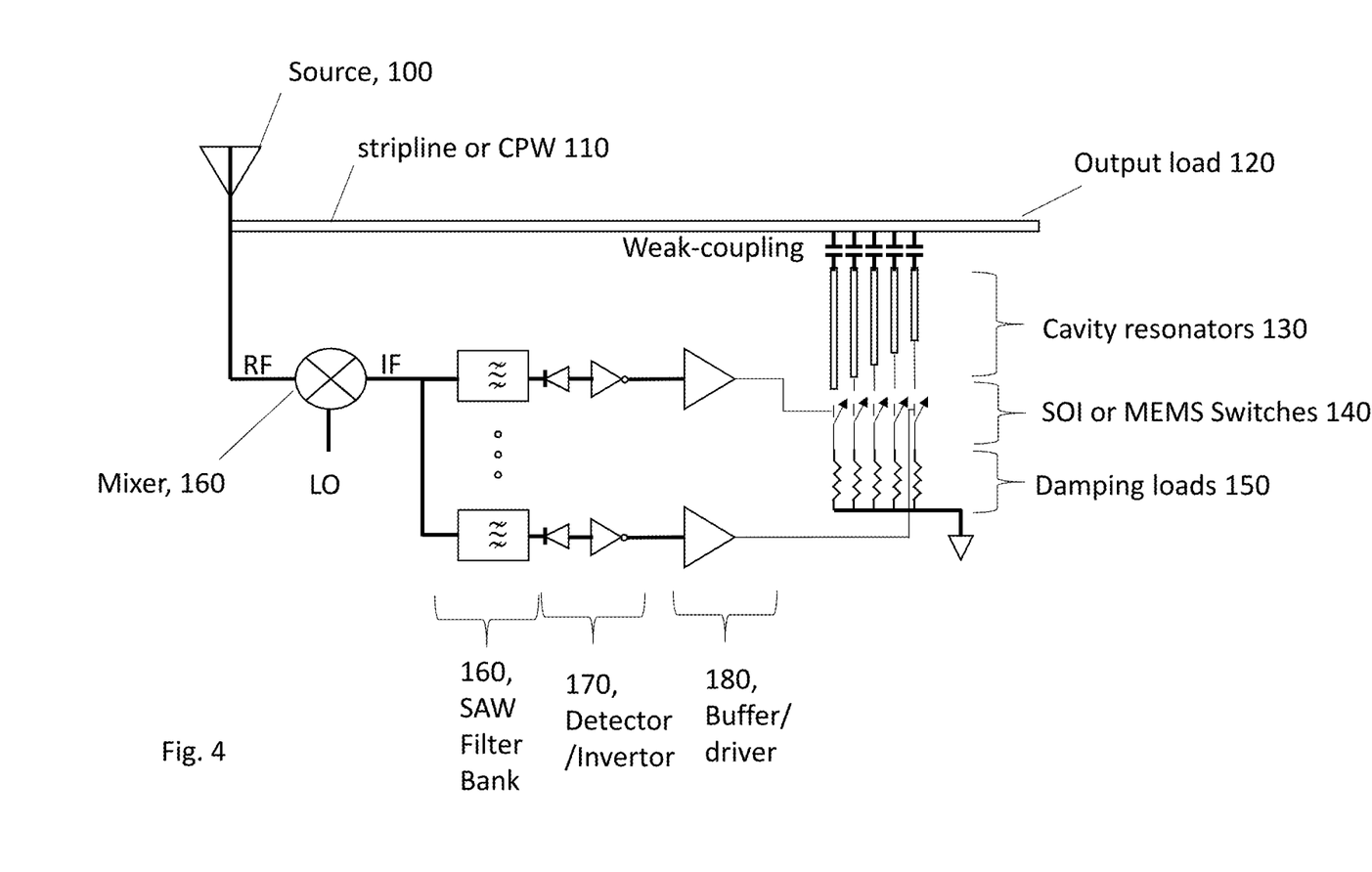
FIG. 4 is a schematic diagram of a fourth exemplary embodiment of a microfabricated notch filter.

FIG. 4 is an illustration showing in some detail another embodiment of the microfabricated notch filter. Similar to the previous embodiments, this fourth embodiment may have a source, 100, which may be an antenna which receives RF radiation broadcast over the air. This antenna may act as a source 110, and the RF radiation is subsequently coupled to a strip lion or coplanar waveguide, 110. The radiation received by the antenna is thereby coupled into the strip light or coplanar waveguide, where it travels down this wave guide 110 to the output load, 120. As before this output load 120 maybe avoid low noise amplifier.

Along the length of the strip line or coplanar waveguide 110 may be a bank of weakly coupled capacitors 125. These capacitors may all be coupled to the strip light or CPW 110. These capacitors may also be couple to a bank of cavity resonators 130. This bank of resonators 130 is a plurality of resonators each with somewhat different dimensions, and each design to resonate a somewhat different frequency. Because of this plurality of resonators, the frequency at which this notch filter operates may be selectable, as described below.

Also coupled to the source antenna 100 maybe an RF mixer, 190. As is well known in radio arts, the radio frequency signal may be mixed with a local oscillator, such that an intermediate frequency results from the mixing process. This intermediate frequency is effectively a downshifted version of the RF signal. For example, if the RF signal is oscillating at 26 GHz, for example, a local oscillator oscillating at 24 GHz may be mixed with the RF signal. As a result in intermediate frequency of 2 GHz may exit the mixer.

In the frequency range of the intermediate frequency 2 GHz, a bank of surface acoustic wave (SAW) filters 160 maybe coupled. A Surface Acoustic Wave (SAW) filter is a filter whereby the electrical input signal is converted to a acoustic wave by interdigital transducers (IDTs) on a piezoelectric substrate such as quartz. SAW filters may be microfabricated, that is, made using lithographic fabrication techniques. These SAW filters 160 are filters which can resonate in the gigahertz frequency range.

This mixer 190 may also be known as a heterodyne circuit. The heterodyne circuit is placed before the weakly coupled transmission lines as described above. This heterodyne circuit measures the frequency of the interferer and then selects the appropriate weakly coupled transmission line or resonant cavity 130 so that this selected transmission line or resonant cavity 130 is opened from it damping load, allowing it to resonate. This in turn draws energy from the first transmission line carrying the signal 110 into the corresponding cavity resonator for which it is resonant.

When the intermediate frequency produced by the mixer 190 or heterodyne circuit matches the SAW filter design frequency, that radiation is passed to a detector/inverter as shown in FIG. 4. The detector/inverter 170 puts out a low signal when the intermediate frequency is resonant with the SAW filter. In all of the cases where the incoming signal does not include a frequency resonant with at least one of the SAW filters, because of the inverter function, a high signal is output from the detector/inverter 170. This high signal then goes to an amplifier 180. The high signal is applied to the MEMs gate switch 140, which closes the gate on which the high signal is applied. As a result cavity resonators 130 which are not resonant with the detected SAW filter frequency, all of those resonators are grounded, because the MEMS switches are closed.

However, if the frequency is detected by the SAW filter bank, and that signal is then inverted by detector 170 and amplified by amplifier 180, the inverter puts out a LOW voltage (on the order 0 volts) which is amplified by amplifier 180.

As a result, the cavity resonator which also corresponds to that frequency will be floating, and thus it will resonate at that frequency and bleed off signal that exists at that frequency. With essentially zero volts applied, the MEMS gate of the MEMS switch will not be energized, and the switch will not be opened. The energy will therefore continue to build with in the corresponding resonant cavity 130, which will attenuate that component of the radiation signal.

Although not shown explicitly in FIG. 4 to avoid unnecessary complication, it should be understood that each cavity resonator 130 in the bank of resonators 130' may be controlled by its own SAW 160, detector/inverter 170 and buffer/driver 180 in the bank of SAW filters, 160' detector/inverters 170' and buffer/drivers 180'.

Although only one bank of cavity resonators 130' separated by a bank of MEMS switch 140' are shown in FIG. 4, it should be understood that this concept may be extended to any number of additional switches and resonators, arranged in parallel as shown in FIG. 3 or in series as shown in FIG. 2. Using such an architecture, the microfabricated notch filter may become essentially tunable, by switching a plurality of additional resonant cavities 130' and 132' into or out of operation within the device. 132' although not shown in FIG. 4 should be understood to mean a second bank similar to 130' but connected in series as was shown in FIG. 2.

Accordingly, FIG. 4 shows a basic architecture of a tunable notch filter which may be used to attenuate and interfering noise signal within a frequency range that is imposed in a communications channel.

Figure 5:
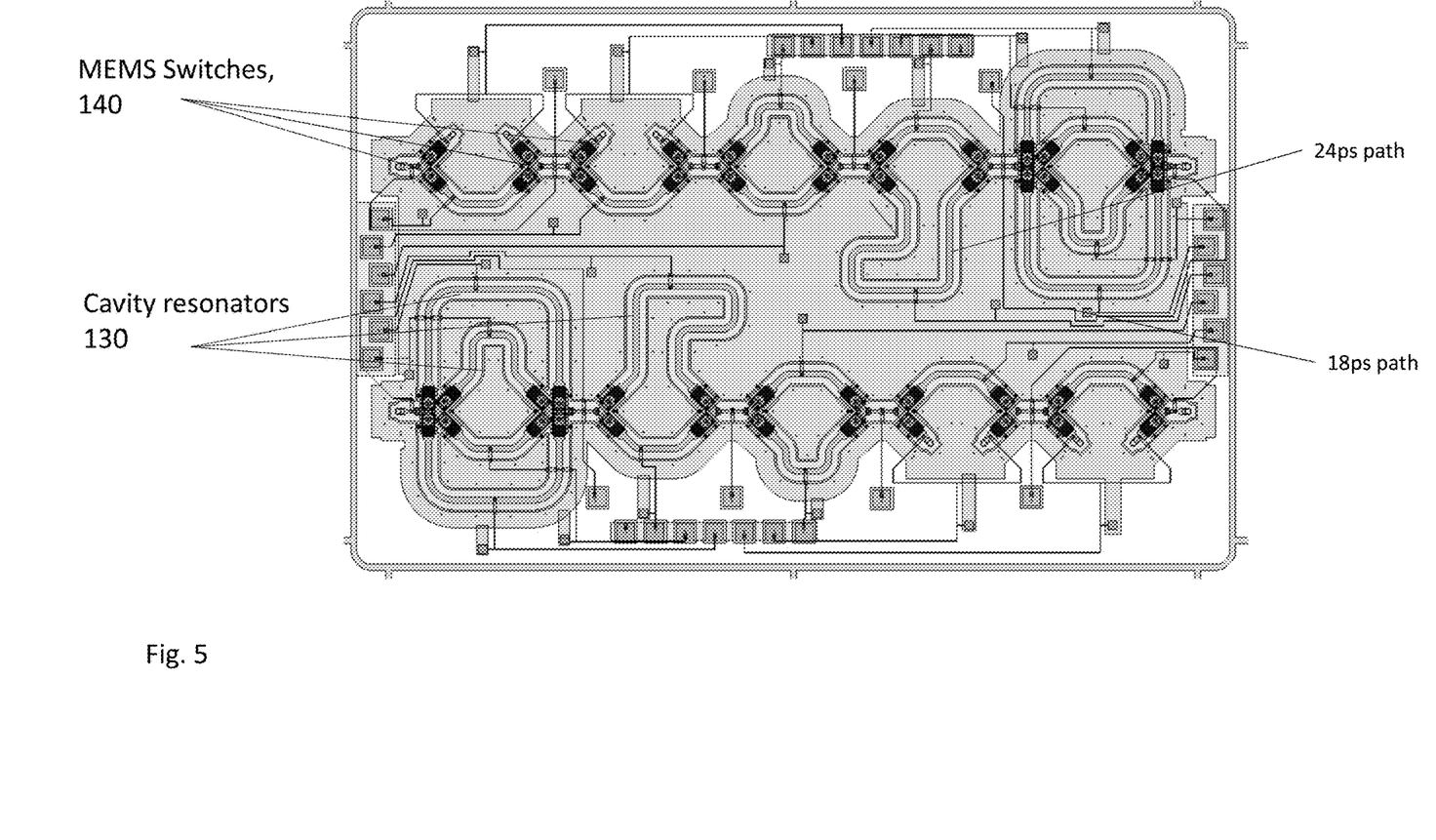
FIG. 5 is a schematic diagram of a fourth exemplary embodiment of a microfabricated notch filter.

FIG. 5 illustrates a microfabricated implementation of the notch filter described above and illustrated schematically in FIGS. 1-4. Shown in FIG. 5 is a bank of MEMS switches 140 which are microfabricated on the substrate. Also shown in FIG. 5 are a plurality of the transmission lines that are labeled cavity resonators 130. These cavity resonators may be delay lines, one of which is labeled 24 picosecond path, another of which is labelled 18 picosecond path. Both of these delay lines will also function as cavity resonators, because the dimensions allow a particular frequency to be supported in a resonant fashion. Accordingly, each of these delay lines shown in FIG. 5 or also can also function as cavity resonators 130.

Figure 6:
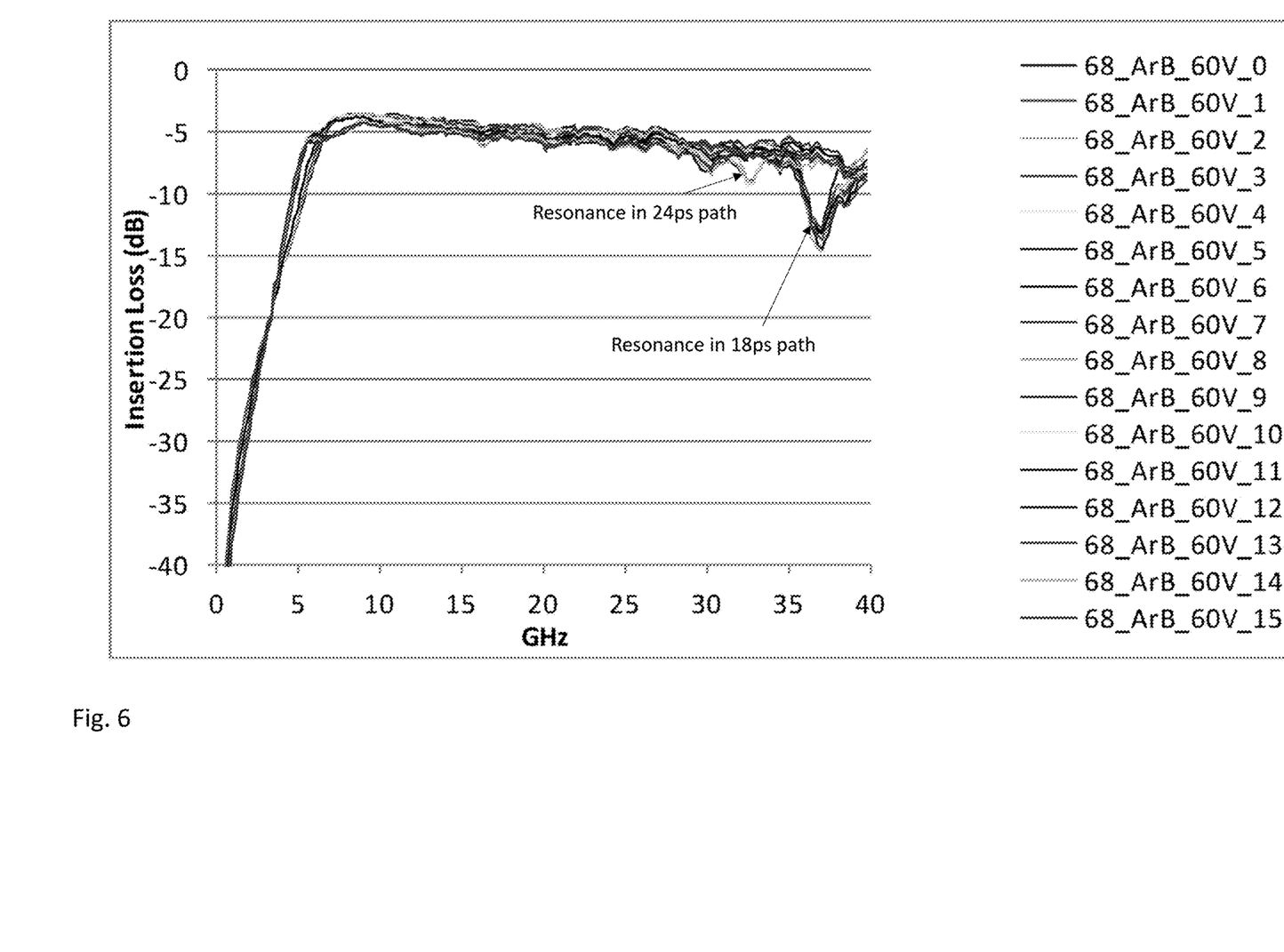
FIG. 6 is a schematic diagram of a fourth exemplary embodiment of a microfabricated notch filter.

FIG. 6 is a data plot showing insertion loss of a signal injected into the bank of cavity resonators shown in FIG. 5. As shown in FIG. 6, the insertion loss on each of the delay lines or cavities resonance cavities, is relatively high until about until a notch appears in the data at precisely the location of the resonance of 24 picosecond path. In addition, another notch appears at the resonance of the 18 picosecond path. This data demonstrate that these delay lies are indeed acting as cavity resonators, and that as cavity resonators, they do indeed bleed off energy from the primary signal, and can attenuate a noise source.

Accordingly, disclosed here is an RF filter which can attenuate a noise source contributing noise to the RF signal. The RF filter may include a receiver for RF radiation at with a first characteristic frequency, wherein the receiver delivers the RF radiation to a transmission line in a substrate. The RF filter may include a noise adding source, wherein the noise adding source adds noise to the RF radiation at a second characteristic frequency. The RF filter may further include at least one resonant cavity dimensioned so as to resonate/support a standing wave at the second characteristic frequency, and a coupling component that provides weak coupling between the cavity and the transmission line, such that radiation at the second characteristic frequency is coupled into the cavity and thereby attenuated in the transmission line.

The coupling component may be a capacitor with a capacitance in the range of less than about 1 picofarad to about 1 nanofarad. The resonant cavity may be a transmission delay line with a path length that results in about a 18 picosecond delay. The resonant cavity may be a transmission delay line with a path length of less than 500 microns.

The resonant cavity may be a bank of resonant cavities having at least 5 resonant cavities of different dimensions, such that the resonant frequency of each resonant cavity is different than an adjacent resonant cavity by at least about 100 MHz, and the bank spans a frequency range of at least about 1 GHz. The RF filter may further comprise at least one MEMS switch, wherein when the MEMS switch is closed, the MEMS switch coupled the at least one resonant cavity to ground, thereby emptying stored energy from the resonant cavity. The bank of resonant cavities may contain resonant cavities that resonate in a band of between about 30 GHz and 35 GHz.

The RF filter may further include at least one SAW filter, wherein when the SAW filter passes one of a plurality of frequencies which make up the RF radiation, with a passband width of less than about 500 MHz.

RF filter may further comprise at least one detector which detects when a frequency matches the passband of the SAW filter, wherein when the SAW filter transmits one of a plurality of frequencies which make up the RF radiation, and wherein when the matching frequency is detected, the detector puts out a HIGH signal.

The RF filter may further comprise at least one inverter which inverts the signal from the detector, such that the inverter puts out a LOW signal when the matching frequency is detected by the detector, and a HIGH signal for all non-matching frequencies. The inverter output may be coupled to a gate of the at least one MEMS switch, such that the switch is closed when the inverter output is HIGH, and open when the inverter output is LOW. The at least one MEMS switch may be coupled to the at least one resonant cavity, such that the MEMS switch empties energy contained in the cavity to ground when the MEMS switch is closed, and leaves the resonant cavity floating when the MEMS switch is open.

Also disclosed here is a method for filtering jamming noise from an RF communications signal. The method may include receiving the RF communications signal with a receiver and delivering the signal to a transmission line, coupling at least one resonant cavity coupled to the transmission line, and coupling at least one MEMS switch to the resonant cavity, such that when the MEMS switch is closed the resonant cavity is grounded, and when the switch is open, the resonant cavity is electrically floating.

Within the method, the at least one resonant cavity is coupled by a capacitor with a capacitance in the range of about 1 picofarad to about 1 nanofarad. Within the method, the resonant cavity is a transmission delay line with a path length that results in about a 18 picosecond delay. The resonant cavity is a transmission delay line with a path length of about 100 microns. Within the method, the resonant cavity may be a bank of resonant cavities, the bank having at least 5 resonant cavities of different dimensions, such that the resonant frequency of each resonant cavity is different than an adjacent resonant cavity by at least about 100 MHz, and the bank spans a frequency range of at least about 1 GHz.

Also disclosed here is a method of making an RF filter. The method may include forming an antenna which receives RF radiation having a first characteristic frequency, wherein the RF radiation travels along a transmission line formed in a substrate, and wherein the RF radiation includes a first characteristic frequency and at least one second frequency, forming at least one resonant cavity dimensioned so as to resonate/support a standing wave at the second characteristic frequency, and coupling the resonant cavity with the transmission line, such that radiation at the second characteristic frequency is coupled into the cavity and thereby attenuated in the transmission line.

Within the method, the coupling may be performed by a capacitor with a capacitance in the range of about 1 picofarad to about 1 nanofarad. The resonant cavity may be a transmission delay line with a path length that results in about a 18 picosecond delay. The resonant cavity may be a transmission delay line with a path length of about 100 microns.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Accordingly, the exemplary implementations set forth above, are intended to be illustrative, not limiting.

What is claimed is:

1. An RF filter, comprising:
   a source of RF radiation at with a first characteristic frequency, wherein the RF radiation travels along a transmission line in a substrate;
   noise added to the RF radiation at a second characteristic frequency;
   at least one resonant cavity dimensioned so as to resonate/support a standing wave at the second characteristic frequency; and
   a weak coupling between the cavity and the transmission line, such that radiation at the second characteristic frequency is coupled into the cavity and thereby attenuated in the transmission line.

2. The RF filter of claim 1, wherein the coupling component is a capacitor with a capacitance in the range of less that about 1 picofarad to about 1 nanofarad.

3. The RF filter of claim 1, wherein the resonant cavity is a transmission delay line with a path length that results in about a 18 picosecond delay, wherein the resonant cavity is a transmission delay line with a path length of less than about 500 microns.

4. The RF filter of claim 1, wherein the resonant cavity is a bank of resonant cavities having at least 5 resonant cavities of different dimensions, such that the resonant frequency of each resonant cavity is different than an adjacent resonant cavity by at least about 100 MHz, and the bank spans a frequency range of at least about 1 GHz, and at least one of the resonant cavities is resonant at the second characteristic frequency.

5. The RF filter of claim 4, further comprising at least one MEMS switch, wherein when the MEMS switch is closed, the MEMS switch coupled the at least one resonant cavity to ground, thereby emptying stored energy from the resonant cavity.

6. The RF filter of claim 5, wherein the bank of resonant cavities contains resonant cavities that resonate in a band of between about 30 GHz and 35 GHz.

7. The RF filter of claim 5, further comprising at least one SAW filter, wherein when the SAW filter passes one of a plurality of frequencies which make up the RF radiation, with a passband width of about 200 MHz.

8. The RF filter of claim 5, further comprising at least one detector which detects when a frequency matches the passband of the SAW filter, wherein when the SAW filter transmits one of a plurality of frequencies which make up the RF radiation, and wherein when the matching frequency is detected, the detector puts out a HIGH signal.

9. The RF filter of claim 8, wherein the at least one SAW filter comprises a bank of SAW filters, each separated from the adjacent SAW filter in frequency by about 200 MHz.

10. The RF filter of claim 5, further comprising:
a subterahertz mixer coupled to the source of RF radiation, wherein the mixer mixes a local oscillator with the RF radiation to produce a down shifted intermediate frequency which falls within the passband of at least one of the at least one SAW filters.

11. The RF filter of claim 9, further comprising at least one inverter which inverts the signal from the detector, such that the inverter puts out a LOW signal when the matching frequency is detected by the detector, and a HIGH signal for all non-matching frequencies.

12. The RF filter of claim 9, wherein the inverter output is coupled to a gate of the at least one MEMS switch, such that the switch is closed when the inverter output is HIGH, and open when the inverter output is LOW.

13. The RF filter of claim 11, wherein the at least one MEMS switch is coupled to the at least one resonant cavity, such that the MEMS switch empties energy contained in the cavity to ground when the MEMS switch is closed, and leaves the resonant cavity floating when the MEMS switch is open.

14. The RF filter of claim 1, wherein the coupling is performed by a capacitor with a capacitance in the range of about 1 picofarad to about 1 nanofarad.

15. The RF filter of claim 1, wherein the resonant cavity is a transmission delay line with a path length that results in about a 18 picosecond delay.

16. The RF filter of claim 1, wherein the resonant cavity is a transmission delay line with a path length of about 100 microns.

17. A method for filtering jamming noise from an RF communications signal, comprising:
receiving the RF communications signal with a receiver and delivering the signal to a transmission line;
coupling at least one resonant cavity coupled to the transmission line; and
coupling at least one MEMS switch to the resonant cavity, such that when the MEMS switch is closed the resonant cavity is grounded, and when the switch is open, the resonant cavity is electrically floating.

18. The method of claim 17, wherein the at least one resonant cavity is coupled by a capacitor with a capacitance in the range of about 1 picofarad to about 1 nanofarad.

19. The method of claim 17, wherein the resonant cavity is a transmission delay line with a path length that results in about a 18 picosecond delay.

20. The method of claim 17, wherein the resonant cavity is a transmission delay line with a path length of less than about 100 microns.

21. The method of claim 17, wherein the resonant cavity is a bank of resonant cavities, the bank having at least 5 resonant cavities of different dimensions, such that the resonant frequency of each resonant cavity is different than an adjacent resonant cavity by at least about 100 MHz, and the bank spans a frequency range of at least about 1 GHz.

22. The method of claim 17, further comprising:
mixing the RF communications signal with a local oscillator to create a downshifted intermediate frequency, wherein the downshifted intermediate frequency falls within a passband of at least one SAW filter.

23. A method of making an RF filter, comprising:
forming an antenna which receives RF radiation having a first characteristic frequency, wherein the RF radiation travels along a transmission line formed in a substrate, and wherein the RF radiation includes a first characteristic frequency and at least one second frequency;
forming at least one resonant cavity dimensioned so as to resonate/support a standing wave at the second characteristic frequency; and
coupling the resonant cavity with the transmission line, such that radiation at the second characteristic frequency is coupled into the cavity and thereby attenuated in the transmission line.

\* \* \* \* \*